United States Patent
Wang et al.

Patent Number: 5,444,003
Date of Patent: Aug. 22, 1995

[54] METHOD AND STRUCTURE FOR CREATING A SELF-ALIGNED BICMOS-COMPATIBLE BIPOLAR TRANSISTOR WITH A LATERALLY GRADED EMITTER STRUCTURE

[75] Inventors: Chung S. Wang, Fremont; Ying-Tsong Loh; Ho-Yuan Yu, all of Saratoga, Calif.

[73] Assignee: VLSI Technology, Inc., San Jose

[21] Appl. No.: 81,761

[22] Filed: Jun. 23, 1993

[51] Int. Cl.⁶ .............. H01L 21/265; H01L 21/70; H01L 27/00; H01L 21/255

[52] U.S. Cl. ........................ 437/31; 437/33; 437/41; 437/44; 437/59; 437/162

[58] Field of Search ........... 148/DIG 9; 257/42, 205, 257/273, 373, 370, 378, 511, 512, 513, 514, 515, 516, 517, 518, 519, 520, 521, 525, 526, 552, 553, 554, 555, 556, 557, 564, 565, 566, 574, 575, 578, 588, 590, 591, 592, 593; 437/31, 32, 33, 34, 41, 44, 54, 59, 141, 149, 150, 154, 161, 162

[56] References Cited

U.S. PATENT DOCUMENTS

| | | | |
|---|---|---|---|
| 4,252,582 | 2/1981 | Anantha et al. | 148/175 |
| 4,347,654 | 9/1982 | Allen et al. | 257/592 |
| 4,748,629 | 5/1988 | Hanagasaki | 437/31 |
| 4,988,632 | 1/1991 | Pfiester | 148/DIG 9 |
| 4,996,581 | 2/1991 | Hamasaki | 257/592 |
| 5,017,995 | 3/1991 | Saejima | 437/31 |
| 5,023,192 | 6/1991 | Josquin et al. | 491/31 |
| 5,096,842 | 3/1992 | Nihira et al. | 437/31 |
| 5,120,668 | 6/1992 | Hsu et al. | 437/41 |
| 5,141,891 | 8/1992 | Arima et al. | 437/44 |
| 5,147,809 | 9/1992 | Won et al. | 437/31 |
| 5,254,485 | 10/1993 | Segawa et al. | 437/31 |
| 5,342,794 | 8/1994 | Wei | 437/31 |

OTHER PUBLICATIONS

Stanley Wolf and Richard N. Tauber "Silicon Processing for the VLSI Era" 280–282, 311–314 (1986).

*Primary Examiner*—Olik Chaudhuri
*Assistant Examiner*—Brian K. Dutton
*Attorney, Agent, or Firm*—Flehr, Hohbach, Test, Albritton & Herbert

[57] ABSTRACT

A bipolar transistor is fabricated in a CMOS-compatible process so as to be self-aligning, with resultant small geometry and improved high frequency performance, and to have improved hot carrier characteristics. The bipolar device has a laterally graded emitter structure that is fabricated in a "top-down" implant process. During fabrication sidewall spacers are formed overlying the peripheral region of the laterally graded emitter. These spacers protect the underlying region against counter-doping during a subsequent intrinsic base implant, and cause the emitter and base contacts to be self-aligning. Because bipolar dimensions are thus reduced, a very narrow base width is achieved, resulting in improved device cutoff frequency. Further, a narrower emitter-base contact separation is achieved, reducing junction area and attendant junction capacitance. A base link region is formed to further improve emitter-base breakdown voltage, and to reduce extrinsic base resistance. A BiCMOS integrated circuit may be fabricated with bipolar transistors of either polarity and with MOS transistors of either polarity. BiCMOS fabrication can occur wherein substantially the same process steps are employed, or wherein specific bipolar and MOS implant steps are decoupled to optimize laterally graded emitter dopant profiles, base-link resistance, and MOS off-state leakage currents.

26 Claims, 10 Drawing Sheets

METHOD AND STRUCTURE FOR CREATING A SELF-ALIGNED BICMOS-COMPATIBLE BIPOLAR TRANSISTOR WITH A LATERALLY GRADED EMITTER STRUCTURE

FIELD OF THE INVENTION

The present invention relates generally to fabricating bipolar transistors for use in bipolar-complementary metal-oxide-silicon ("BiCMOS") applications, and more particularly to a method and structure providing a self-aligned bipolar transistor with a lateral graded emitter.

BACKGROUND OF THE INVENTION

It is common in the art to combine bipolar transistors and complementary metal-oxide silicon ("CMOS") field effect transistors in a bipolar-complementary metal-oxide-silicon ("BiCMOS") transistor configuration. BiCMOS configurations are widely used in fabricating ever smaller, faster and increasingly complex integrated circuits. BiCMOS integrated circuits are fabricated layer-by-layer, typically on a silicon substrate, with one or more layers at least partially covered with an oxide such as $SiO_2$.

However in BiCMOS fabrication, some process steps used to fabricate high performance bipolar devices frequently cannot be used to simultaneously create MOS devices. The inability to make dual use of many processing steps thus adds to the complexity of BiCMOS fabrication, and can result in reduced device yield.

In general, high cut-off frequency performance is desired in a BiCMOS circuit. Such high frequency performance is enhanced by providing small geometry bipolar devices having reduced junction capacitance and extrinsic base resistance, obtained by using increased extrinsic base region dopant concentration. Small geometry devices not only promote switching speed, but also allow greater device density within a BiCMOS circuit. But fabricating smaller geometry devices can require tighter fabrication process alignment tolerances that increase manufacturing complexity.

Scaling-down bipolar devices can promote degradation of device characteristics, especially current gain and off-state leakage. Degradation occurs because scaled-down dimensions and increased doping concentrations tend to increase the electric field intensities to which the devices are exposed, since the operating voltage level is generally fixed. For example, reverse biased depletion regions within a small geometry bipolar transistor can be subjected to relatively high intensity electric fields.

Electrons encountering these increased field intensities acquire increased kinetic energy and accelerate beyond an equilibrium state, becoming what is commonly termed "hot electrons" or "hot carriers". Hot carriers can escape from the semiconductor, surmount and remain trapped within an oxide layer within the device. The trapped charges form a local depletion region, wherein holes and electrons recombine, typically with a decreased surface recombination lifetime. Unfortunately, the holes required to neutralize or satisfy the surface recombination are holes diverted from the transistor's base current. The resultant surface effect increases base current, thereby decreasing the transistor current gain ($\beta$).

It is known in the art to obtain a higher current gain ($\beta$) device by providing an abrupt emitter-base transition, with resultant improved emitter injection efficiency. However, fabricating such emitter-base regions in small geometry bipolar devices using BiCMOS compatible techniques is challenging. This is because of the difficulty in independently controlling the junction depths and dopant profiles of the various doped regions.

It is known in the art to improve bipolar device high frequency performance by increasing dopant concentrations in the extrinsic base region, thereby reducing extrinsic base resistance. But under reverse bias conditions, the increased dopant concentrations result in smaller depletion regions that increase the electric field to which the emitter-base junction is subjected. This in turn can produce increased numbers of hot carriers, with resultant reduced breakdown voltage and degradation of device performance.

It is also known in the art to suppress hot carrier effects using a laterally graded emitter structure that decreases peak electric fields between the emitter and base regions of a transistor. See for example H. Honda, et al., I.E.E.E. CH2865-4/90/0000-0227 (1990). But while it is recognized that an abrupt emitter-base transition can improve bipolar current gain ($\beta$), the method disclosed by Honda, et al. does not readily allow independent control over the bipolar transistor active (intrinsic) and inactive (extrinsic) base regions, or the profile of the laterally graded emitter for purposes of optimizing bipolar performance. Further, the method disclosed by Honda, et al. does not yield small geometry, self-aligning devices, or the improved high frequency performance that such small geometry can provide. In short, while contemporary integrated circuit design demands small geometry high speed bipolar transistors, the smaller geometry dictates stricter manufacturing process alignments. Further, smaller geometry can promote significant hot carrier effects that degrade bipolar transistor performance. While reducing extrinsic base resistance can enhance bipolar transistor performance, the resultant increased extrinsic base region dopant concentration promotes hot carrier generation.

What is needed is a process to fabricate a small geometry, self-aligned bipolar transistor having a laterally graded emitter to suppress hot carrier generation. Such bipolar transistor should exhibit decreased extrinsic base resistance, and improved emitter-base junction breakdown voltage characteristics. Preferably such process and structure should be BiCMOS compatible, allowing bipolar and CMOS fabrication steps to occur simultaneously on a common integrated circuit substrate. The present invention discloses such a process and structure.

SUMMARY OF THE INVENTION

In summary, the present invention provides a self-aligning bipolar transistor with a laterally graded emitter that decreases electric field intensities, thus reducing hot carrier generation. Reducing hot carrier generation preserves the transistor current gain ($\beta$), and improves the emitter-base junction breakdown voltage. Because it is self-aligning, the resultant transistor has small geometry with resultant improved high frequency performance. According to the present invention, bipolar transistors may be fabricated simultaneously and side-by-side with CMOS devices on a common substrate.

In one embodiment, polysilicon conductors are initially defined over desired substrate regions, on either side of emitter and gate stacks, for use in fabricating underlying bipolar and MOS devices. These conductors are implanted with a high impurity first-polarity dopant, the doped conductors serving as a dopant source for underlying regions during subsequent drive-in. One such conductor permits external contact to the underlying base region of a bipolar transistor to occur remote from the base itself, thus minimizing alignment tolerances. Other such conductors are used to make contact with the source and drain regions of a MOS device.

Masking and etching steps expose the substrate on either side of the emitter and gate stacks, into which exposed substrate regions a like-polarity dopant is implanted. A thermal oxidation step then drives-in dopant from the doped polysilicon conductors to form bipolar base regions and MOS source and drain regions. The doped substrate regions are also driven-in to form bipolar device base link (or extrinsic base) regions, and lightly doped drain ("LDD") regions for MOS devices of the same polarity type as the bipolar transistor's base region. The base-link regions contribute to lower base resistance and higher breakdown voltage, while the lightly doped drain regions contribute to improved MOS device hot carrier performance.

Next, laterally graded emitter regions and LDD regions for MOS devices of opposite polarity from the bipolar device are formed. A second-polarity dopant is implanted into substrate regions unprotected by the oxidized doped polysilicon conductors or the emitter or gate stacks. As such, the laterally graded regions result from a "top-down" process that is highly BiCMOS compatible, as contrasted with regions that are created by more conventional lateral diffusion techniques.

Spacers are formed above the lateral regions of the graded emitter, and above the lateral regions of the graded drains. The inter-spacer distance advantageously determines emitter width, while the spacers self-align the emitter and base contacts. This permits a small emitter-base junction area and junction capacitance, thus promoting good high cutoff frequency characteristics for the transistor being fabricated. The spacers also protect the lateral emitter region from counter-doping during formation of the bipolar intrinsic base, which is accomplished by implanting and driving-in a first polarity dopant.

As regards MOS devices, the protective gate stack is removed and a blanket threshold voltage implant is carried out to adjust the MOS threshold voltages. As regards bipolar devices, the emitter region is completed by preferably depositing polysilicon over the active emitter region, into which polysilicon a high impurity second-polarity dopant is implanted and driven in. The resultant emitter has a dopant concentration that decreases laterally in the regions underlying the spacers, thus reducing hot carrier generation under reverse biased emitter-base junction conditions and improving emitter-base breakdown voltage. The MOS gates are then defined, preferably to overlap the drain regions to improve hot carrier performance. Conventional back-end processes complete formation of the BiCMOS structure.

An alternative embodiment intentionally decouples several of the above-noted initial process steps, such that high dopant concentration and deep junction base link regions are formed in a bipolar transistor, while permitting low dopant concentration and shallow junctions to be formed in lightly doped drain regions of a MOS transistor. So doing permits fabrication of a bipolar transistor having reduced base resistance and a better controlled laterally graded emitter, and also permits fabrication of a MOS device having improved off-state leakage characteristics.

In this embodiment, doped polysilicon conductors are formed on either side of base and emitter stacks, as above-described. The MOS transistor under formation is protectively masked, and p-type and n-type dopant ion implant procedures are sequentially carried out on the bipolar transistor under formation, the n-type dopant being implanted with shallower energy.

The MOS mask is removed, and a polyoxide layer is grown over the bipolar and MOS transistors under formation, which process drives-in all previously introduced dopants. This results in the formation of P+ extrinsic base regions, base link regions and a laterally graded emitter in the NPN bipolar transistor under formation. This also creates P+ source/drain regions for PMOS transistors under formation, and creates N+ source/drain regions for NMOS transistors under formation. In this fashion, the dopant profile of the laterally graded emitter region, and the resistance of the base link may be optimized by adjusting respective implant conditions and polyoxide layer growth.

A P-type dopant is implanted into the exposed regions adjoining the gate stack of any PMOS transistors, during which time any NMOS and bipolar transistors are protectively masked. Similarly, N-type dopant is implanted into the exposed regions adjoining the gate stack of any NMOS transistors, during which time any PMOS and bipolar transistors are protectively masked. These implants for lightly doped drain/source regions in the respective MOS devices under formation, these regions being optimized by adjusting the respective implant conditions. The remainder of the fabrication steps may be completed as above-described for the first embodiment.

Other features and advantages of the invention will appear from the following description in which the preferred embodiments have been set forth in detail in conjunction with the accompanying drawings.

DESCRIPTION OF THE PREFERRED EMBODIMENTS

In brief overview, the present invention provides a bipolar transistor with a laterally graded emitter that decreases electric fields across the emitter-base junction, thus reducing hot carrier generation under reverse bias and improving emitter-base breakdown characteristics. In addition, self-alignment and small device geometry result from the formation of internal spacers during fabrication. These spacers help define the active emitter-base region of the bipolar transistor. The spacers also permit narrow and moderately doped base-link regions to connected extrinsic P+-doped and intrinsic base regions, to form high density, high performance bipolar devices.

Figure 1:
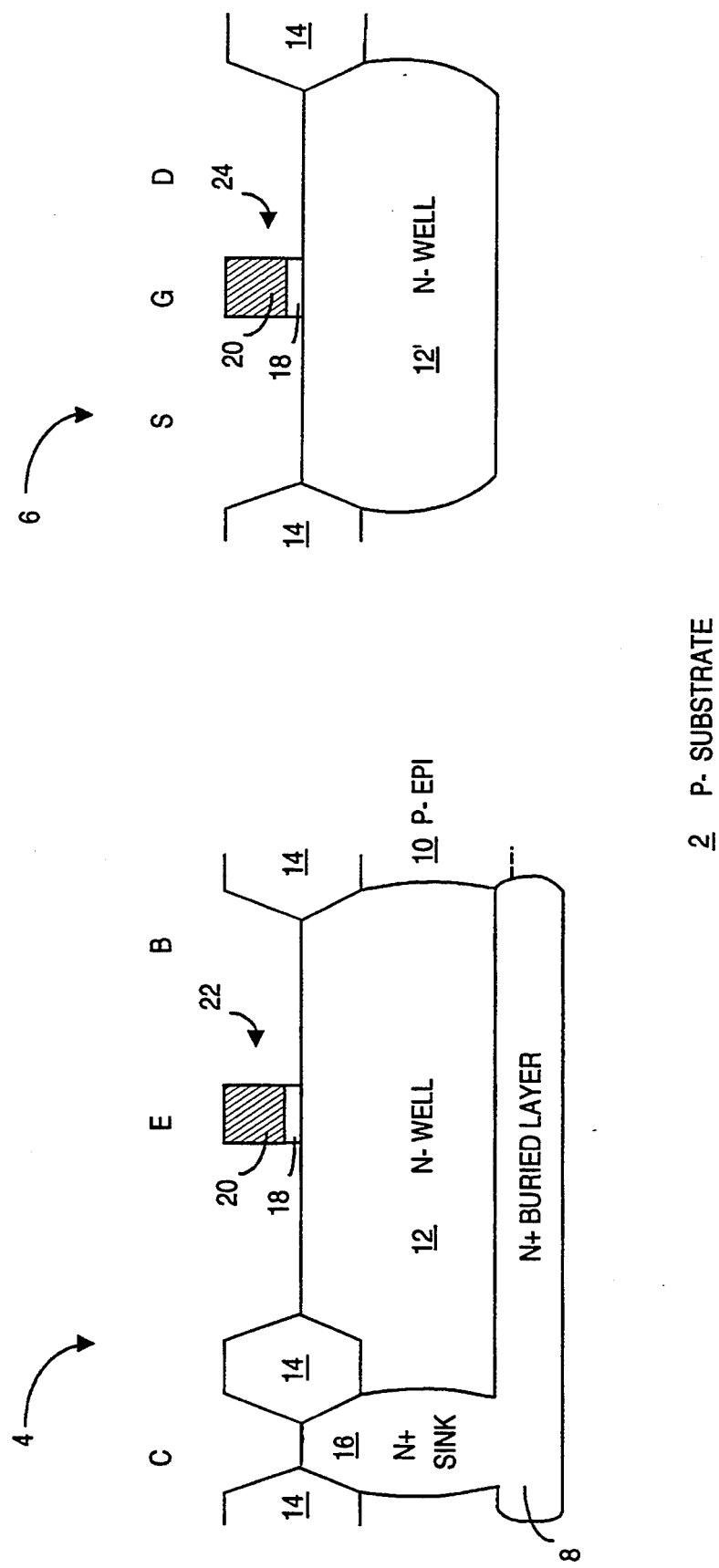
FIG. 1 depicts initial emitter stack definition of the emitter region for a bipolar transistor, and initial definition of a conduction channel for a MOS transistor.

FIG. 1 depicts a preliminary stage in the preferably simultaneous formation on a substrate 2 of a bipolar NPN transistor 4 and a P-channel MOS ("PMOS") field effect transistor 6. In FIG. 1, "C" "E" and "B" indicate locations of the underlying collector, emitter and extrinsic base regions to be formed for bipolar transistor 4, while "S" "G" and "D" indicate locations of the underlying source, gate and drain regions to be formed for PMOS 6.

The preferred embodiment will be described with reference to fabricating an NPN bipolar transistor 4 and a PMOS transistor 6. However, it is understood that with slightly modified procedures, bipolar transistor 4 could be fabricated as a PNP device, and/or MOS transistor 6 could be fabricated as an N-channel MOS ("NMOS") device. In FIG. 1, a P— substrate 2 has selectively diffused into it an N+ buried layer 8 that helps reduce bulk resistance of transistor 4's collector region, after which P— expitaxial (or "epi") regions 10, and N— wells 12, 12' are defined. Regions of local oxide ("LOCOS") 14 are formed to isolate adjacent devices on substrate 2 (e.g., devices 4 and 6), after which an N+ sink region 16 is formed, communicating with the N+ buried layer 8.

A pad oxide layer 18 (e.g., $SiO_2$) is then thermally grown to a thickness of perhaps 400Å over the structure thus defined. A low pressure chemical vapor deposition ("LPCVD") of nitride 20 (e.g., $Si_3N_4$) is then deposited atop the oxide 18 to a thickness of about 1,600Å. An emitter mask and a gate mask are next defined (steps not shown), and the masked structures are preferably reactive ion etched ("RIE"). The RIE step removes the nitride everywhere except for the masked regions 20, producing the straight-walled pattern shown in FIG. 1.

Because of selectivity, the RIE etching stops at the level of the oxide layer 18.

A preferably wet chemical etch is then employed to remove all of the thermally grown oxide layer 18, except for the oxide regions underlying nitride layer 20, as shown in FIG. 1. Collectively, NPN transistor 4's emitter pad oxide 18 and overlying nitride 20 will be referred to as emitter stack 22. As regards PMOS transistor 6, the same layers will be referred to collectively as gate stack 24. The fabrication steps thus described are common in the art of BiCMOS fabrication, and do not per se form part of the present invention.

Figure 2:
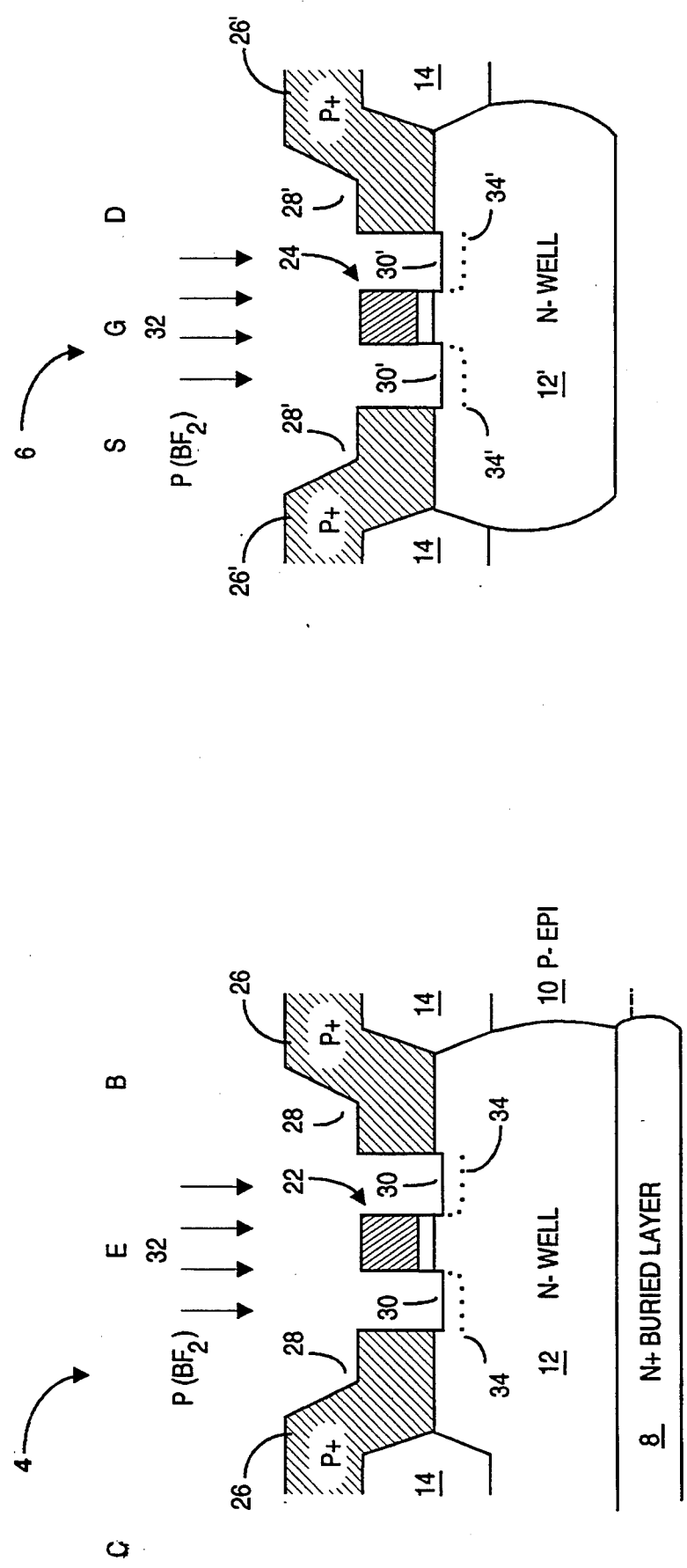
FIG. 2 depicts formation of polysilicon base electrodes and dopant implant for base link regions for an NPN bipolar transistor, and formation of polysilicon source and drain electrodes and dopant implant for lightly doped drain regions for a PMOS transistor, according to the present invention.

With reference to FIG. 2, doped polysilicon electrodes are defined for use in contacting the extrinsic base region of NPN transistor 4 and the source and drain regions of PMOS transistor 6. These doped electrodes are also used as a source of dopant to be subsequently driven-in to form underlying doped regions.

As shown, a perhaps 3,000Å thick layer of polysilicon 26, 26' is deposited, preferably by LPCVD, and is then P+ doped, preferably by ion implantation. If (as depicted) MOS transistor 6 is to be a PMOS device, the same P+ dopant is simultaneously introduced into the polysilicon 26' overlying transistor 6. Preferably such P+ doping results from boron implantation with a dosage of about $5 \times 10^{15}/cm^2$.

If, however, MOS transistor 6 is to be an NMOS device, polysilicon 26' is masked for protection during the P+ doping of NPN transistor 4's polysilicon 26. After completion of P+ doping of transistor 4's polysilicon 26 and PMOS 6's polysilicon 26' NMOS transistor 6's polysilicon 26' is selectively N+ doped. The N+ doping is preferably by implanting arsenic with a dosage of about $1 \times 10^{16}/cm^2$, and FIG. 3B depicts an NMOS device 6'' with an N+ doped polysilicon 26''. The associated masking, etching and implant steps are known in the semiconductor fabrication art, and are not depicted or described in further detail.

NPN transistors 4 has its base polysilicon electrode regions 26 and 28 masked, and PMOS transistor 6 has its source and drain polysilicon regions 26' and 28' masked. Next a preferably reactive ion etching step is carried out, producing gap regions 30 and 30,' respectively adjoining the emitter stack 22 and gate stack 24. The etching step typically results in some etching into the N— well 12, 12' as shown. The width of regions 30, 30' preferably is as small as feasible, e.g., about 0.3μ, as determined by the resolution of the sub-micron lithographic pattern process used.

After suitable masking, a preferably boron ion implant procedure is carried out, as depicted by arrows 32 in FIG. 2. Preferably $BF_2$ is used for this implant, with a dopant concentration in the approximate range $2.0 \times 10^{13}/cm^2$ to $5.0 \times 10^{13}/cm^2$. This implant introduces dopant that will be used to form P+ base link regions 34 (shown in phantom) for NPN bipolar transistor 4, and lightly doped drain ("LDD") regions 34' (shown in phantom) for the PMOS transistor 6. Preferably the BF2 implant energy is maintained sufficiently low as not to substantially penetrate the emitter stack 22 or the gate stack 24. For example, an energy level of about 60 KeV will provide a boron doped range of about 0.04μ in the gap regions 30 and 30', and will be completely blocked by the emitter stack 22 and the gate stack 24.

Figure 3A:
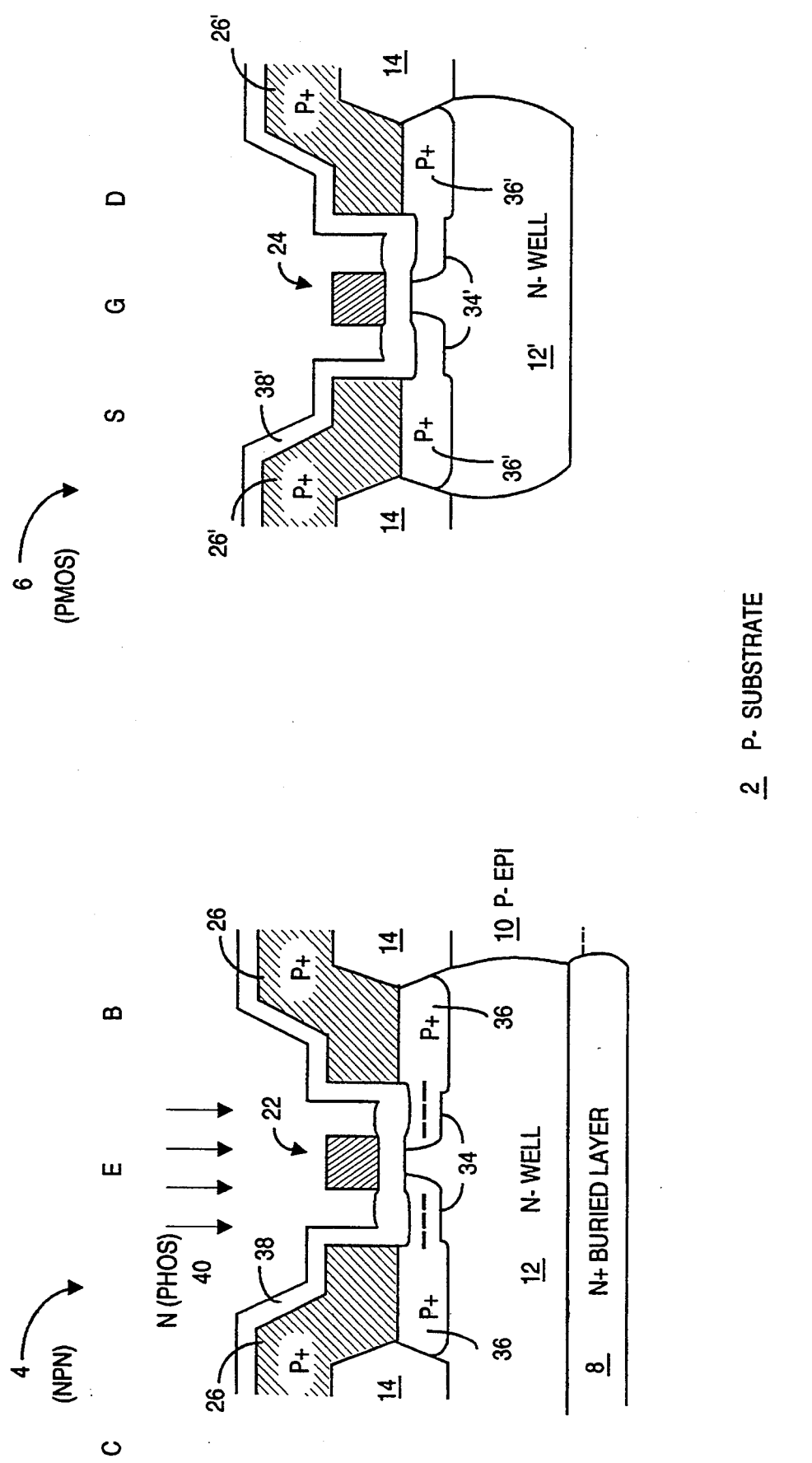
FIG. 3A depicts the extrinsic base and base link regions and formation of the lateral emitter region for an NPN bipolar transistor, and depicts the heavily doped and lightly doped source and drain regions for a PMOS transistor, according to the present invention.
Figure 3B:
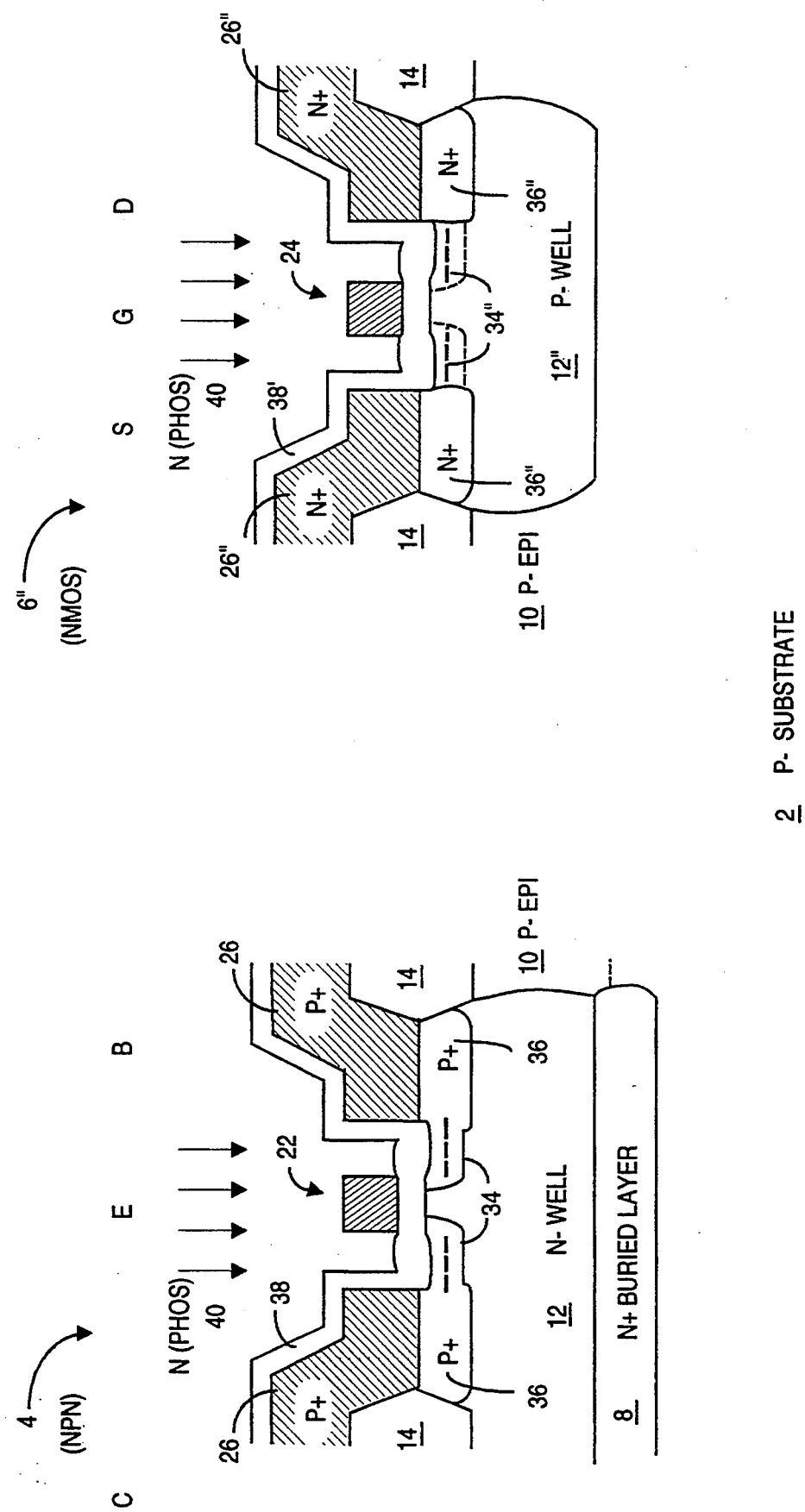
FIG. 3B depicts the extrinsic base and base link regions and formation of the lateral emitter region for an NPN bipolar transistor, and depicts the heavily doped and lightly doped source and drain regions for an NMOS transistor, according to the present invention.

Using the dopant introduced in the previous process steps, respective P+ extrinsic base 36, base link 34 regions are formed for bipolar transistor 4, and source/- drain regions 36', and lightly doped drain regions 34' are next formed for PMOS transistor 6 FIG. 3A depicts process steps for an NPN bipolar transistor 4 and a PMOS transistor 6, while FIG. 3B depicts similar steps in the formation of an NMOS transistor 6", according to the present invention.

As depicted by FIG. 3A, the P+ polysilicon layer 26, 26' is thermally oxidized to form polysilicon oxide layer 38, 38' of about 1,000Å thickness. This thermal oxidation step simultaneously drives-in the P+ link regions 34, and the resultant P+ extrinsic base region 36 in the NPN transistor 4. Similarly in PMOS transistor 6, thermal oxidation drives-in the lightly doped drain/source regions 34' and P+ source/drain regions 36'. As shown in FIG. 3B, where an NMOS transistor 6" is to be formed, layer 26" will have been doped N+, and the thermal oxidation step will drive-in and form the N+ source/drain regions 36".

The above-described preferred method of doping polysilicon and then driving-in the dopant creates less likelihood of damage to the underlying silicon substrate 2, than would be the case if a relatively high doping dosage were directly implanted. Note in FIG. 3A (and similarly FIG. 3B) that the relatively higher impurity dopant from the polysilicon conductors 26, 26' penetrates downward more deeply into regions 36, 36' than does the base-link or LDD dopant into regions 34, 34'.

Base link regions 34 comprise a narrow medium-doped intrinsic base region that will connect bipolar transistor 4's lightly doped intrinsic base 52 (when formed) to heavily P+-doped extrinsic base regions 36. This advantageously increases the breakdown voltage of the emitter-base junction (when formed). At the same time, the extrinsic base resistance is decreased, thus improving high frequency performance.

Peripheral or lateral regions of what will be a laterally graded emitter for bipolar device 4 are now created, which process also produces lightly doped drain ("LDD") regions for the PMOS device 6 (FIG. 3A) or the NMOS device 6" (FIG. 3B). As indicated by arrows 40, N-type dopant is implanted into the exposed regions of bipolar transistor 4 and NMOS transistor 6" adjoining emitter and gate stacks 22 and 24. During this implantation, stacks 22 and 24 advantageously block dopant penetration into the underlying silicon structure. As a result, this N-dopant process primarily affects the underlying relatively exposed regions 34, 34" in devices 4 and 6. Preferably the dopant is phosphorus with a dosage in the approximate range $5 \times 10^{13}/cm^2$ to $1 \times 10^{14}/cm^2$ at an energy of 40 KeV.

As depicted by the negative signs in regions 34 in FIGS. 3A and 3B, NPN bipolar transistor 4 has an N-emitter region that, upon completion of the BiCMOS process, will form a peripheral or laterally graded emitter. Similarly, as depicted in FIGS. 3A and 3B, PMOS device 6 and NMOS device 6" will have relatively lightly doped drain/source regions 34', 34". The phantom lines surrounding the minus signs in FIG. 3B denote where the completed lightly doped source/drain regions 34" will be after driving-in. Note that regions 34, 34', 34" are well defined within a relatively heavily doped region of opposite polarity.

When fabrication is complete, the above-described gradient-doped regions 34 for NPN device 4, and LDD regions 34', 34" for MOS devices 6' or 6" will advantageously reduce hot carrier generation within the respective device by expanding the space-charge limiting region under reverse bias.

However these regions do not per se contribute to a small device geometry promoting good high frequency performance.

According to the present invention, sidewall spacers are used to define the active emitter width and MOS channel length, and to make the resultant devices self-aligning. This provides the advantage of small geometry without significant penalty in fabrication tolerances.

Figure 4:
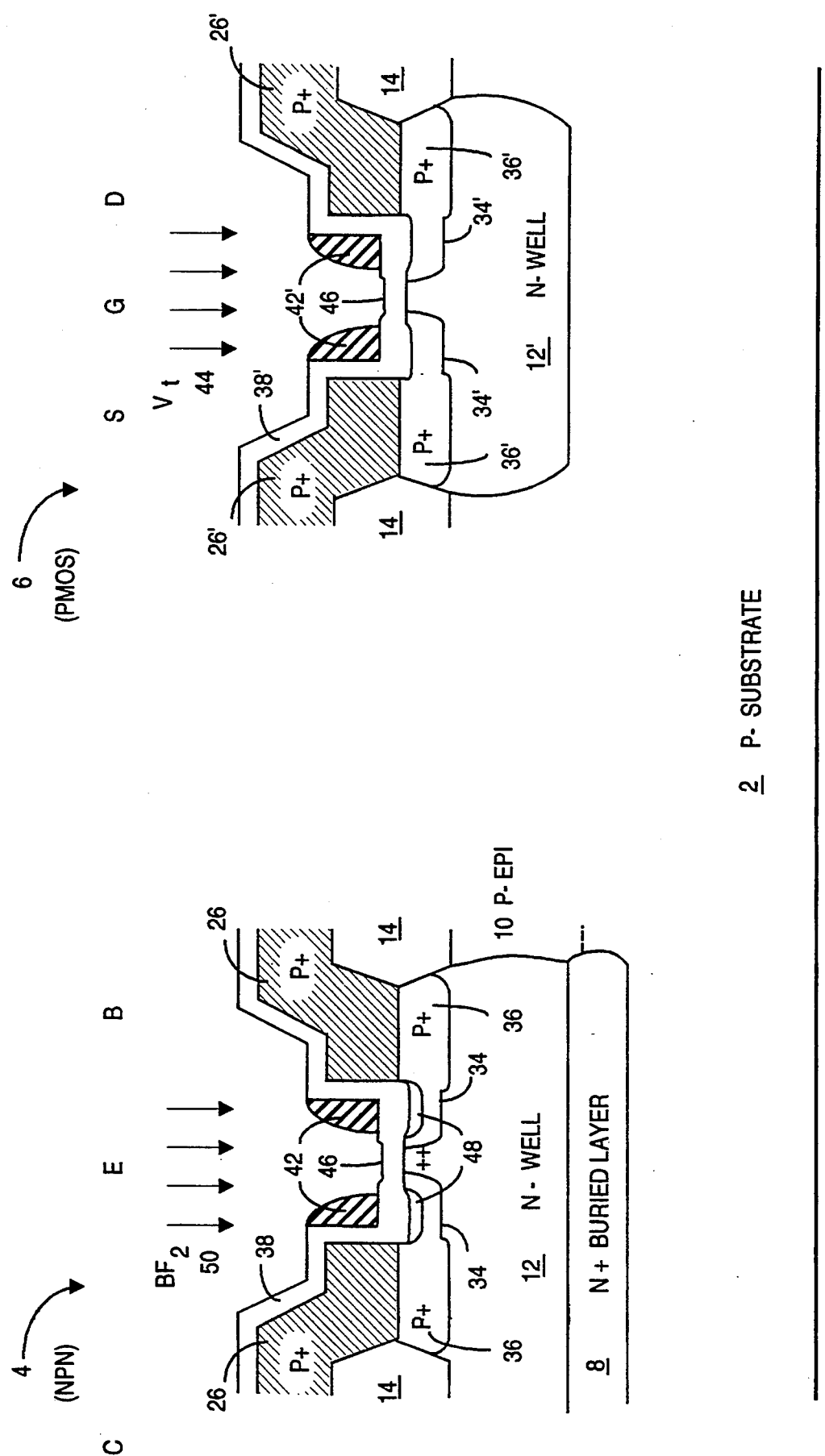
FIG. 4 depicts the formation of side-walled spacers and intrinsic base for an NPN transistor, and the formation of side-walled spacers and threshold voltage implant for a PMOS transistor, according to the present invention.

Fabrication of these sidewall spacers 42, 42' will be described with reference to FIG. 4. Before fabricating these spacers, the protective nitride layer 20 is stripped from emitter and gate stacks 22, 24, preferably using RIE. A 2,000Å to 3,000Å layer polysilicon or nitride layer is then deposited, preferably with LPCVD. This layer is then etched back (preferably using RIE) to form spacers 42, 42' as shown in FIG. 4, according to the present invention. The formation of polysilicon or nitride spacers is known in the art of CMOS technology, and for that reason intermediate steps in the formation of these spacers are not shown in FIG. 4.

As indicated by arrows 44, a blanket $V_t$ implant is used to adjust the threshold voltage of MOS device 6. Preferably the dosage of the $V_t$ implant is about $1 \times 10^{12}/cm^2$ for both PMOS and NMOS devices. Next, the pad oxide 38 overlying the emitter region of bipolar transistor 4, and the pad oxide 38' overlying the gate region of MOS device 6 is etched off, and is replaced by a thermal growth of gate oxide 46.

The heat associated with growing gate oxide 46 drives-in the N-type dopant to form the N— laterally graded emitter region 48 for NPN transistor 4, and the N— lightly doped drain/source region 34" for the NMOS transistor 6". PMOS and NMOS devices 6, 6" are then covered with a protective layer of photo-resist (not shown) during the subsequent base implant step for NPN device 4.

Next NPN device 4 is masked and a P— type (boron or BF$_2$) implant is carried out (indicated by arrows 50) to form the intrinsic base region. Preferably the P+ intrinsic base dopant has a dosage of about $1 \times 10^{13}/cm^2$ to $3 \times 10^{13}/cm^2$ and is BF$_2$ at an energy level of about 40 KeV. The intrinsic base region is indicated in FIG. 4 by plus signs, and is depicted as fully formed region 52 in FIG. 5. During this intrinsic base implant, spacers 42 automatically and effectively protect the underlying laterally graded (N—) emitter region 48 from counter-doping.

It is also apparent from FIG. 4, that spacers 42, 42' provide a smooth transition to the device geometry, leading gradually into the emitter or gate region. With further regard to PMOS device 6, spacers 42' minimize overlap capacitance between the gate region and the source and/or drain electrodes, improving the PMOS device's high frequency performance.

Figure 5:
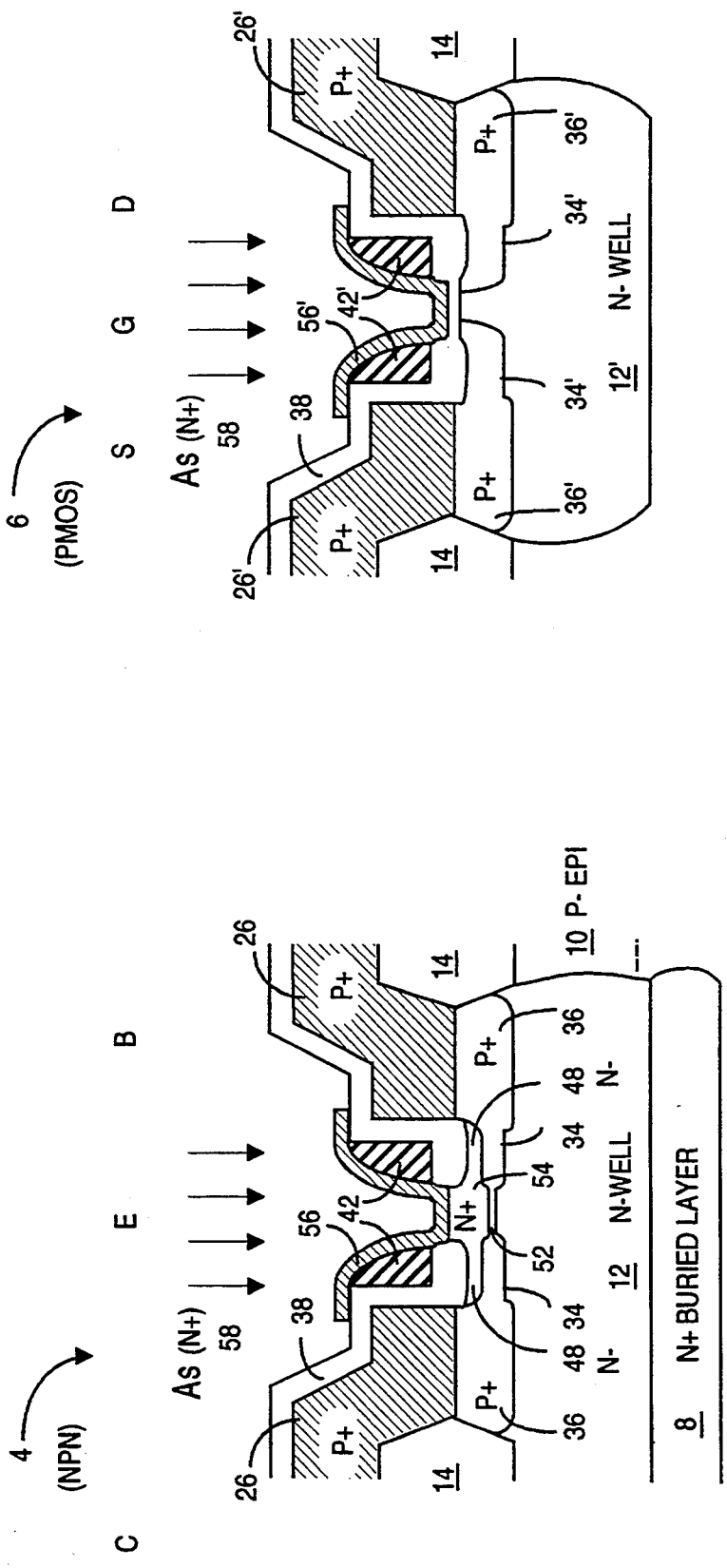
FIG. 5 depicts definition of a doped polysilicon emitter and formation of the active region of a laterally graded NPN emitter region, and definition of a MOS gate, according to the present invention.

With reference to FIG. 5, the N+ active region 54 of the emitter of NPN transistor 4 is next formed. The oxide layer 38 between spacers 42 (e.g., overlying NPN 4's central or active emitter region) is removed, preferably with RIE. The RIE also strips off the photoresist overlying MOS 6, which has served its protective function.

A second layer deposition of polysilicon 56, 56' is made, preferably using a LPCVD process. Next, as shown by arrows 58, an implant of N+ material such as As is made into the polysilicon 56, 56'. This implant provides a dopant source for forming NPN 4's active N+ emitter region 54, and MOS 6's gate 56'. The doped polysilicon 56 is then masked and etched, preferably with RIE. A drive-in process at about 920° C. causes the N+ dopant in polysilicon 56 to enter and form NPN 4's N+ active emitter region 54. Alternatively, rather than dope polysilicon 56 and drive-in the dopant, the N+ emitter region 54 could of course be formed more conventionally by implanting As and then defining a metal contact trace.

As a result of the top-down implantation processes described, NPN transistor 4 has a laterally graded emitter 48, and PMOS transistor 6 has lightly doped drain/-source regions 34'. When NPN transistor 4's emitter-base junction (52, 54) is reverse biased, it is understood that the relatively lightly doped N− emitter region 48 will have a wider space charge region than will the relatively heavier doped N+ active emitter region 54. The desired effect is that the reverse emitter-base potential is distributed over a larger effective space charge distance, thus reducing the magnitude of the electric field. This in turn minimizes hot carrier generation, avalanche condition, and tends to protect the emitter-base junction against premature voltage breakdown. Similarly, the LDD regions 34' in PMOS 6 reduce electric fields and hot carrier generation in device 6.

Figure 6:
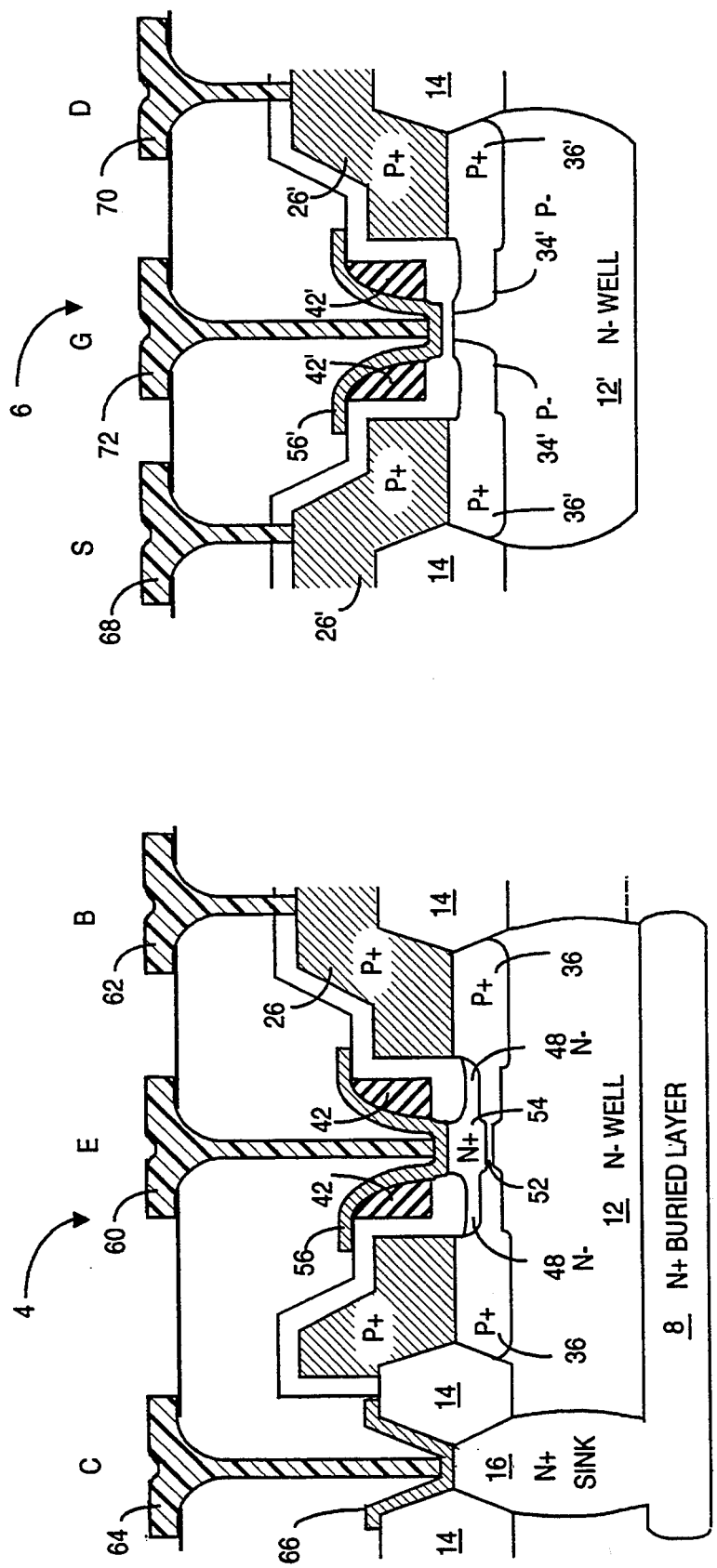
FIG. 6 depicts completed laterally graded BiCMOS devices, and illustrates the small device geometry provided by the spacers shown in FIG. 4, according to the present invention.

FIG. 6 depicts completion of transistors 4 and 6, after normal backend processing has occurred. Note that the contacts 60, 62 to transistor 4's emitter and base regions are self-aligning because of spacers 42. Conductor 60 contacts transistor 4's emitter via doped polysilicon 56, while conductor 62 contacts transistor 4's base via doped polysilicon 26, advantageously at a region remote from the base itself. Conductor 64 contacts transistor 4's collector region via patterned doped polysilicon 66, in the conventional fashion.

FIG. 6 also shows that doped polysilicon 26' permits conductors 68 and 70 to make remote contact with PMOS transistor 6's source and drain regions, while conductor 72 makes self-aligning contact with PMOS transistor 6's doped polysilicon gate 56'. It is understood that source and drain conductors 68, 70 may be treated interchangeably.

It will be appreciated from the foregoing that this aspect of the present invention promotes small device geometry by permitting looser fabrication tolerances than, for example, the process disclosed in the Honda, et al. reference I.E.E.E. CH2865-4/90/0000-0227 (1990) wherein conductor contact is made directly (and necessarily precisely) to the active base region itself.

Those skilled in the art recognize that for deep submicron MOS transistors (e.g., devices having a channel length <0.5μ), two most critical device characteristics are off-state leakage caused by short channel roll-off, and surface punch through effects. Preferably, off-state leakage is suppressed by using a low dopant concentration and shallow junction in the lightly doped drain (LDD) regions 48' of MOS device 6.

By contrast, however, reduction of base resistance in bipolar transistor 4 is accomplished using a high dopant concentration and a deep junction in the base link 34. In addition to reducing base resistance, such fabrication improves bipolar performance and permits better control of the laterally graded emitter dopant profile.

In the embodiment to be described, the process steps for accomplishing these tasks, namely what has been described with reference to FIGS. 2, 3 and 4, are decoupled. According to the present invention, carrying out these various process steps separately enhances optimization of BiCMOS device performance and promotes reliability-related design requirements. While the resultant BiCMOS process complexity increases, the additional complexity is justified by the improved BiCMOS performance, especially for deep sub-micron devices.

The decoupled BiCMOS process embodiment commences after the preliminary formation of bipolar and MOS devices as depicted in FIG. 1 has occurred, including formation of the doped polysilicon conductors 26, 26' or 26' (as shown in FIG. 3B).

Figure 7:
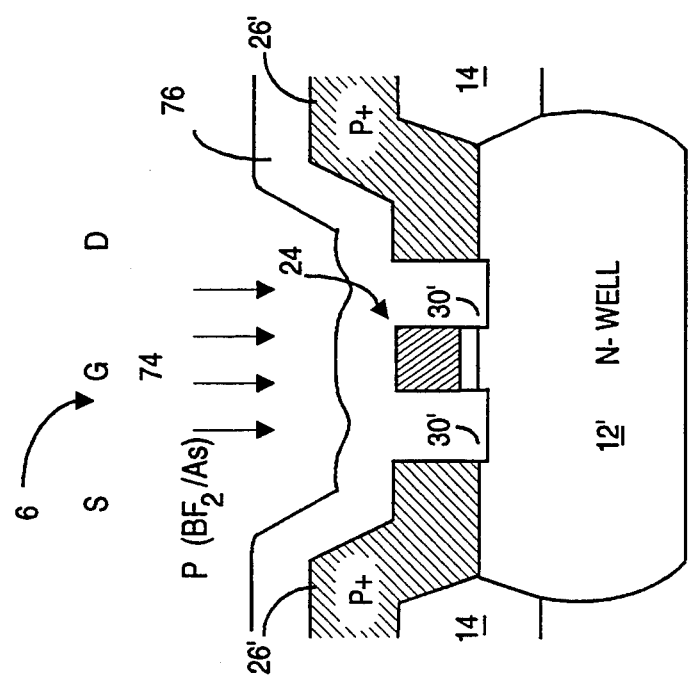
FIG. 7 depicts an alternative embodiment, wherein dopants are sequentially implanted to provide optimization of an emitter-base junction and base link resistance, according to the present invention.
Figure 7:
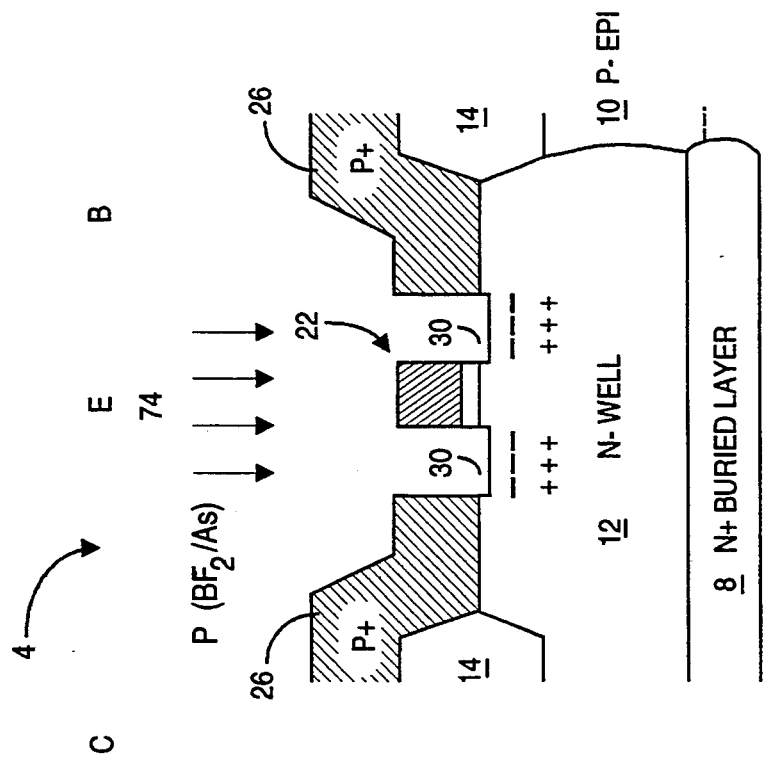

With reference to FIG. 7, next P-type and N-type ion implant procedures are sequentially carried out selectively (using the same masking step) for bipolar transistor 4, as depicted by arrows 74. Preferably $BF_2$ (P-type) is implanted with a medium dosage in the approximate range $1 \times 10^{14}/cm^2$ using an energy level of about 60 KeV, and arsenic (N-type) is implanted with a medium dosage in the same approximate $1 \times 10^{14}/cm^2$ range, but at a shallower energy level, perhaps 50 KeV.

In FIG. 7, positive and negative signs in N-well 12 depict the boron and arsenic sequential implants, respectively. These sequential implants optimize the emitter-base junction of bipolar device 4, and the resistance of the base link 34. As shown in FIG. 7, a layer of photoresist 76 prevents the preferably $BF_2$ and As dopants from being introduced into MOS device 6.

Figure 8A:
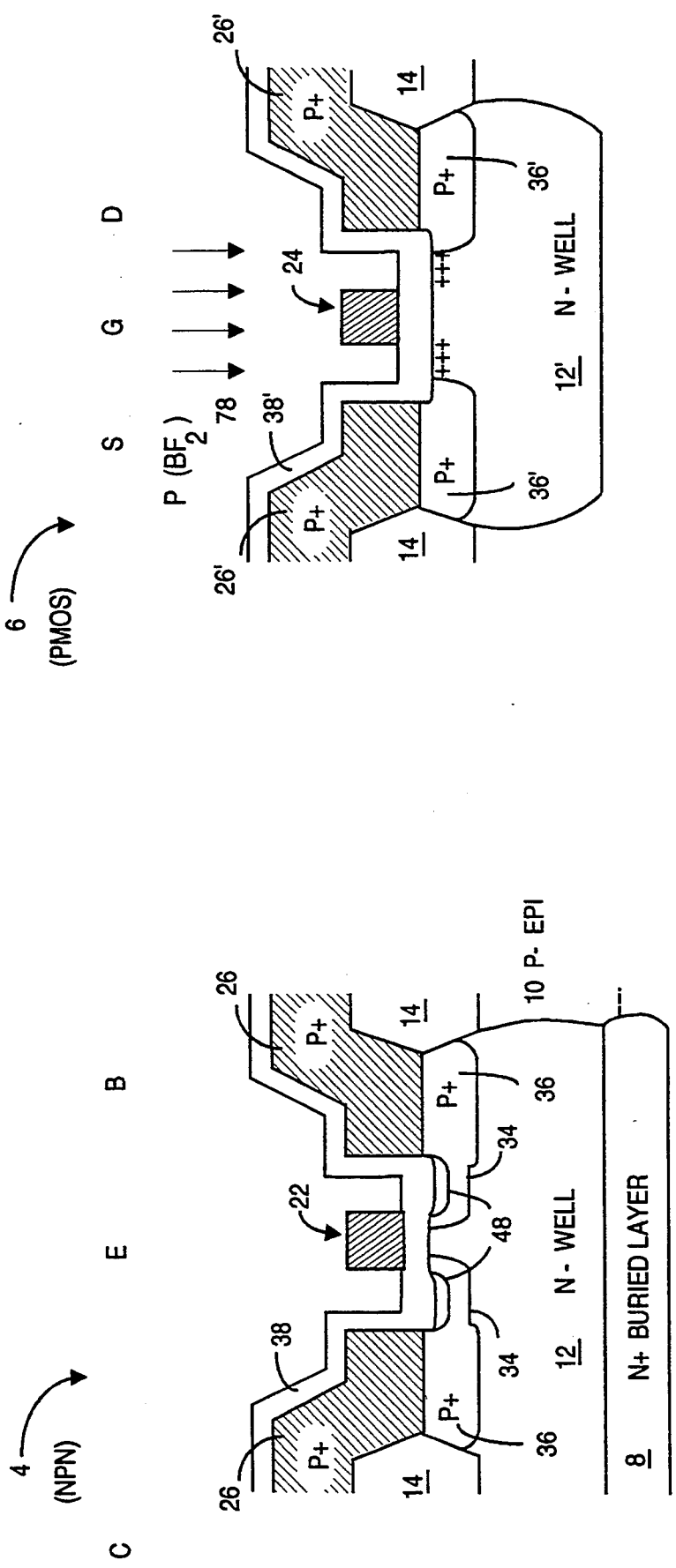
FIG. 8A depicts a driving-in step and formation of lightly doped drain regions for a NPN and PMOS BiCMOS device fabricated as shown in FIG. 7, according to the present invention.
Figure 8B:
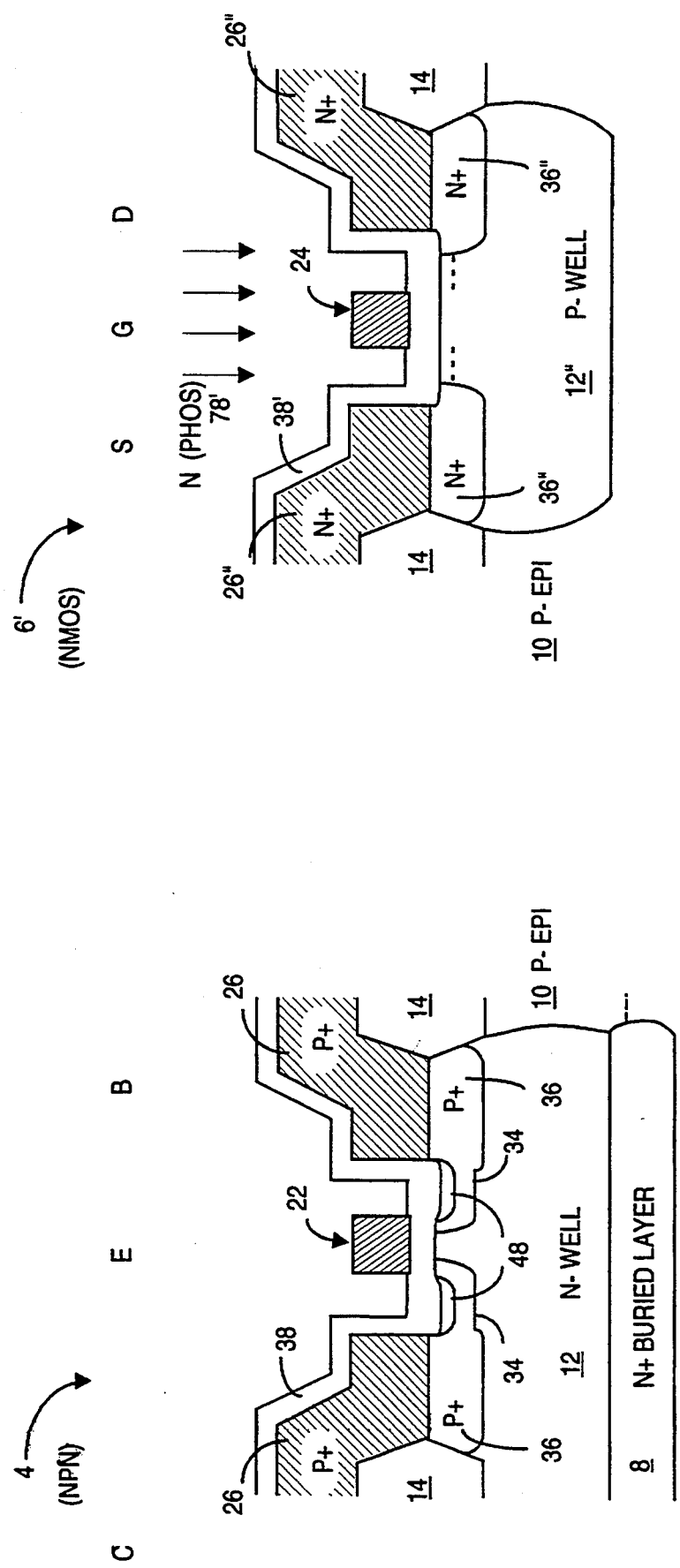
FIG. 8B depicts a driving-in step and formation of lightly doped drain regions for a NPN and NMOS BiCMOS device fabricated as shown in FIG. 7, according to the present invention.

FIGS. 8A and 8B continue the process for the formation of an NPN device 4, and a PMOS and an NMOS device 6, 6', respectively. A high temperature thermal oxidation step grows polysilicon oxide layer 38 and 38' to about 1,000Å thickness. The oxidation step drives-in simultaneously all dopants introduced in the previous process steps to form P+ extrinsic base regions 36, base link regions 34 and laterally graded emitter region 48 for bipolar transistor 4. At the same time, driven-in dopants also form the P+ source and drain regions 36' for PMOS transistor 6 (FIG. 8A), and also N+ source and drain regions 36" for NMOS transistor 6' (FIG. 8B). Note in FIGS. 8A and 8B that the dopant profile of the laterally graded emitter region 48, and the base link resistance may readily be optimized by suitably adjusting the previous respective implant and polysilicon oxide 38, 38' formation regimes.

Next, the exposed regions of the MOS devices adjoining the gate stack 24 are implanted. For a PMOS 6, a P-type dopant, indicated by arrows 78 in FIG. 8A, is implanted, preferably $BF_2$ with a dosage of about $2 \times 10^{13}/cm^2$ at about 60 KeV. During this implantation, any NMOS transistor 6' on the substrate are protected by a suitable mask.

Similarly, as indicated by arrows 78' in FIG. 8B, N-type is implanted into the exposed regions of NMOS transistor 6' adjoining gate stack 24. Of course, during this N-implantation, bipolar transistor 4 and PMOS transistor 6 are protected by a suitable mask. Preferably the N− dopant is phosphorous or arsenic, with a dosage of about $3.0 \times 10^{13}/cm^2$ at about 50 KeV. The thus introduced P-type and N-type dopants, indicated in FIGS. 8A and 8B by positive and negative signs respectively, are used in forming respective P and N lightly doped drain (LDD) regions 34', 34" (see FIGS. 3A, 3B, for example).

Thus, according to the present invention, PMOS devices 6 and NMOS devices 6' may be fabricated with optimized characteristics, especially off-state leakage, by appropriate adjustment of respective implant conditions to form LDD regions 34', 34". The remainder of the fabrication process steps may be completed as described earlier for the prior embodiment.

Modifications and variations may be made to the disclosed embodiments without departing from the subject and spirit of the invention as defined by the following claims. For example, while the preferred embodiment has been described with reference to a BiCMOS device, the present invention may be practiced to fabricate bipolar transistors on a substrate that does not also include MOS devices.

What is claimed is:

1. A method of fabricating on a substrate a bipolar transistor having reduced hot carrier generation and self-aligning emitter and base contacts, the method comprising the following steps:
   (a) forming, at least above a portion of a region where a base will be formed on the substrate, a polysilicon conductor doped with a dopant of a first conductivity type
   (b) following step (a), implanting a dopant of a first conductivity type into substrate regions overlying regions where lateral emitter regions will be formed adjacent said portion;
   (c) driving-in said dopant of a first conductivity type from said polysilicon conductor into said region where said base will be formed, and driving-in said dopant of a first conductivity type from said substrate into said regions where said lateral emitter regions will be formed, forming thereby an extrinsic base region and a base-link region;
   (d) implanting a dopant of a second conductivity type into said regions where a said lateral emitter regions will be formed to form said lateral emitter regions, wherein said dopant of a second conductivity type is of opposite conductivity type from said dopant of a first conductivity type;
   (e) forming spaced-apart side-walled spacers overlying at least a portion of said lateral emitter regions, said side-walled spacers being spaced-apart by a distance defining a region where an active emitter will be formed bounded laterally by said lateral emitter regions;
   (f) following step (e), performing a second implantation step to implant a dopant of a first conductivity type into a region of said substrate laterally bounded by said spaced-apart side-walled spacers, forming thereby an intrinsic base region;
   (g) implanting into said region where said active emitter will be formed a dopant of the second conductivity type having a higher impurity concentration than has said dopant of the first conductivity type implanted at step (b), forming thereby said active emitter region of higher dopant impurity than said lateral emitter regions;
   (h) providing an external base contact to said bipolar transistor, said contact being coupled to said polysilicon conductor overlying said extrinsic base region; and
   (i) providing an external emitter contact to said active emitter region of said bipolar transistor;
   wherein said bipolar transistor has a laterally graded emitter that reduces generation of hot carriers, and wherein said spaced-apart side-walled spacers permit self-alignment of said external emitter contact and self-alignment of said external base contact to said bipolar transistor.

2. The method of claim 1, including an initial step of forming an emitter stack above said region where an active emitter will be formed, said emitter stack including an oxide layer and a nitride layer overlying said oxide layer.

3. The method of claim 1, wherein step (a) includes (i) depositing said polysilicon conductor and performing at least one step selected from the group consisting of (ii) using said dopant of the first conductivity type that includes boron, and (iii) using a said dopant of the first conductivity type having a dopant concentration of about $1 \times 10^{16}/cm^2$.

4. The method of claim 1, wherein step (b) includes at least one step selected from the group consisting of (i) preliminarily etching said polysilicon conductor to expose said substrate regions overlying regions where said lateral emitter regions will be formed, and (ii) implating said dopant of the first conductivity type that includes $BF_2$.

5. The method of claim 1, wherein:
   step (c) is performed while thermally oxidizing said polysilicon conductor;
   wherein an oxide layer is formed over said polysilicon conductor, said oxide layer protecting said polysilicon conductor from counter-doping during step (d).

6. The method of claim 2, wherein:
   step (c) is performed while thermally oxidizing said polysilicon conductor, wherein an oxide layer is formed over said polysilicon conductor; and
   during step (d), said oxide layer protects said polysilicon conductor from counter-doping, and said emitter stack protects said region where said active emitter will be formed from doping.

7. The method of claim 1, wherein at least one of step (b), step (d) and step (f) is performed with a dopant concentration of about $2 \times 10^{13}/cm^2$ to about $5 \times 10^{13}/cm^2$.

8. The method of claim 7, wherein at least one of step (b) and step (f) is performed with a said dopant of the first conductivity type that includes $BF_2$.

9. The method of claim 7, wherein step (d) is performed with a said dopant of the second conductivity type that includes phosphorus.

10. The method of claim 1, wherein step (g) includes at least one parameter selected from the group consisting of (i) using a said dopant of the second conductivity type that includes arsenic, (ii) using a dopant concentration of about $1 \times 10^{16}/cm^2$, and (iii) depositing a polysilicon conductor overlying said active emitter region and said spaced-apart side-walled spacers, said polysilicon conductor then being doped with a dopant of the second conductivity type.

11. The method of claim 1, wherein step (e) includes at least one step selected from the group consisting of (i) forming said spaced-apart side-walled spacers from a material chosen from the group consisting of polysilicon and nitride, and (ii) forming said spaced-apart side-walled spacers by depositing to a thickness of about 2,000Å to about 3,000Å a material chosen from the group consisting of polysilicon and nitride, and by etching-back material so deposited to form said spaced-apart side-walled spacers.

12. A BiCMOS compatible method of fabricating on a substrate a bipolar transistor having reduced hot carrier generation and self-aligning emitter and base contacts, the method comprising the following steps:

(a) forming a protective emitter stack at least above a region where an active base and emitter will be formed on the substrate;

(b) forming, above a portion of a region where a base will be formed on said substrate, a polysilicon conductor doped with a dopant of a first conductivity type;

(c) exposing regions of said substrate adjacent said emitter stack and overlying regions where lateral emitter regions will be formed on said substrate;

(d) implanting a dopant of a first conductivity type into regions of said substrate exposed in step (c);

(e) driving-in dopant from said polysilicon conductor into said region where said base will be formed, and driving in said dopant from said substrate into said regions where said lateral emitter regions will be formed, forming thereby an extrinsic base region and a base-link region;

(f) implanting a dopant of a second conductivity type into said regions where said lateral emitter regions will be formed, forming thereby said lateral emitter regions, wherein said dopant of a second conductivity type is of opposite conductivity type from said dopant of a first conductivity type;

(g) forming spaced-apart side-walled spacers overlying at least a portion of said lateral emitter regions, said side-walled spacers being spaced-apart by a distance defining a region where an active emitter will be formed bounded laterally by said lateral emitter regions;

(h) following step (g), implanting a dopant of a first conductivity type into a region of said substrate laterally bounded by said spaced-apart side-walled spacers, forming thereby an intrinsic base region;

(i) implanting into said region where said active emitter will be formed a dopant of the second conductivity type having a higher impurity concentration than has said dopant of the first conductivity type implanted at step (d), forming thereby said active emitter region of higher dopant concentration than said lateral emitter regions;

(j) providing an external base contact to said bipolar transistor, said contact being coupled to said polysilicon conductor overlying said extrinsic base region; and (k) providing a self-aligning emitter contact to said active emitter region of said bipolar transistor;

wherein said bipolar transistor has a laterally graded emitter that reduces generation of hot carriers, and wherein said spaced-apart side-walled spacers permit self-alignment of said external emitter contact and self-alignment of said external base contact to said bipolar transistor.

13. The method of claim 12, wherein step (b) includes at least one step selected from the group consisting of (i) depositing said polysilicon conductor, (ii) using a dopant that includes $BF_2$, and (iii) using a dopant concentration of about $1 \times 10^{16}/cm^2$.

14. The method of claim 12, wherein at least one of step (d), step (f) and step (h) is performed with a dopant concentration of about $2 \times 10^{13}/cm^2$ to about $5 \times 10^{13}/cm^2$, and with a dopant including $BF_2$.

15. The method of claim 12, wherein:

step (e) is performed while thermally oxidizing said polysilicon conductor;

wherein an oxide layer is formed over said polysilicon conductor, said oxide layer protecting said polysilicon conductor from counter-doping during step (f).

16. The method of claim 12, wherein step (f) is performed with a said dopant of a second conductivity type that includes phosphorus.

17. The method of claim 12, wherein step (g) includes at least one step selected from the group consisting of (i) forming said spaced-apart side-walled spacers from a material chosen from the group consisting of polysilicon and nitride, and (ii) forming said spaced-apart side-walled spacers by depositing to a thickness of about 2,000Å to about 3,000Å a material chosen from the group consisting of polysilicon and nitride, and by etching-back material so deposited to form said spacers.

18. The method of claim 12, wherein step (i) includes at least one parameter selected from the group consisting of (i) using a dopant that includes arsenic, (ii) using a dopant concentration of about $1 \times 10^{16}/cm^2$, and (iii) depositing a polysilicon conductor overlying said active emitter region and said spaced-apart side-walled spacers, which polysilicon conductor is then doped with a dopant of the second conductivity type.

19. The method of claim 12, including additional steps fabricating substantially simultaneously a MOB transistor on said substrate, wherein:

step (a) further includes forming a protective gate stack above a region where a gate will be formed;

step (b) further includes forming, at least partially above a region where a source will be formed and a region where a drain will be formed, a polysilicon conductor doped with a dopant of a first conductivity type;

step (c) further includes exposing regions of said substrate adjacent said gate stack and overlying regions where lightly doped lateral drains will be formed on said substrate;

step (d) further includes implanting a dopant of a first conductivity type into said regions of said substrate exposed in step (c) adjacent said gate stack over overlying said regions where lightly doped lateral drains will be formed on said substrate;

step (e) further includes driving-in said dopant implanted in further step (d) to forms aid,lightly doped drain regions for said MOS transistor;

step (g) further includes forming spaced-apart side-walled spacers overlying said lightly doped,drain regions of said MOS transistor, said side-walled spacers being spaced apart by a distance defining said region where a gate will be formed;

step (h) further includes implanting a dopant to adjust a threshold voltage of said MOS transistor; and step (k) includes providing a self-aligning gate for said MOS transistor.

20. The method of claim 12, further including fabricating substantially simultaneously a MOS transistor on said substrate.

21. The method of claim 20, wherein for formation of an NPN bipolar transistor and a PMOS transistor, step (d) includes sub-steps of (i) growing a protective thermal oxide over said MOS transistor, (ii) sequentially implanting exposed regions of said bipolar transistor with $BF_2$ and As.

22. The method of claim 21, wherein said $BF_2$ is implanted with at least one characteristic selected from the group consisting of (i) a concentration in an approximate range $1 \times 10^{14}/cm^2$ and an energy level of about 60

KeV, and wherein said As is implanted with at least one characteristic selected from the group consisting of (iii) a concentration in an approximate range $1 \times 10^{14}/cm^2$ and an energy level of about 50 KeV.

23. The method of claim 22, wherein upon completion of step (e), said bipolar transistor has P+ extrinsic base regions, base link regions and N− laterally graded emitter regions, and said MOS transistor has source and drain regions of said dopant of a first conductivity type introduced in step (b);

wherein a dopant profile of said laterally graded emitter regions, and a resistance of said base link regions are determined by sub-steps (i) and (ii) in said step (d).

24. The method of claim 22, wherein prior to step (g), exposed regions of said MOS transistor adjoining said gate stack are implanted with a dopant whose conductivity type matches conductivity type for said dopant introduced at step (b).

25. The method of claim 24, wherein said MOS transistor is a PMOS transistor, said dopant implanted in said exposed regions is $BF_2$ having at least one characteristic selected from the group consisting of (i) a concentration of about $2 \times 10^{13}/cm^2$, and (ii) an energy of about 60 KeV, and wherein during implant of said dopant any NMOS transistors on said substrate are protected by a mask.

26. The method of claim 24, wherein said MOS transistor is an NMOS transistor, said dopant implanted in said exposed regions is selected from the group consisting of arsenic and phosphorous, and said dopant has at least one characteristic selected from the group consisting of (i) a concentration of about $3 \times 10^{13}/cm^2$ and an energy of about 50 KeV, and wherein during implant of said dopant any bipolar transistors and PMOS transistors on said substrate are protected by a mask.

* * * * *